(12) United States Patent
Taub

(10) Patent No.: US 6,532,178 B2
(45) Date of Patent: *Mar. 11, 2003

(54) REDUCING LEVEL SHIFTER STANDBY POWER CONSUMPTION

(75) Inventor: Mase J. Taub, Elk Grove, CA (US)

(73) Assignee: Intel Corporation, Santa Clara, CA (US)

(*) Notice: Subject to any disclaimer, the term of this patent is extended or adjusted under 35 U.S.C. 154(b) by 0 days.

This patent is subject to a terminal disclaimer.

(21) Appl. No.: 10/097,801

(22) Filed: Mar. 14, 2002

(65) Prior Publication Data

US 2002/0131306 A1 Sep. 19, 2002

Related U.S. Application Data

(63) Continuation of application No. 09/811,025, filed on Mar. 16, 2001, now Pat. No. 6,385,099.

(51) Int. Cl.[7] .................................................. G11C 7/00
(52) U.S. Cl. .............................. 365/189.11; 365/185.18; 365/226
(58) Field of Search ....................... 365/189.11, 185.18, 365/226; 327/333

(56) References Cited

U.S. PATENT DOCUMENTS

| 6,226,224 B1 | * | 5/2001 | Banba et al. | 365/185.18 |
| 6,297,624 B1 | * | 10/2001 | Mitsui et al. | 365/226 |
| 6,385,099 B1 | * | 5/2002 | Taub | 365/189.11 |

* cited by examiner

Primary Examiner—Huan Hoang
(74) Attorney, Agent, or Firm—Trop, Pruner & Hu, P.C.

(57) ABSTRACT

A level shifter may be utilized in a flash memory to reduce the standby power consumption. The level shifter may be coupled so that the gate-to-source voltage of the input transistor is reduced during standby operations to reduce leakage current. At the same time, the source of the input transistor may be coupled to a lower voltage during active level shifting operations. Thus, good transistor characteristics may be achieved with reduced leakage currents.

20 Claims, 2 Drawing Sheets

REDUCING LEVEL SHIFTER STANDBY POWER CONSUMPTION

This is a continuation of prior application Ser. No. 09/811,025 filed Mar. 16 2001 now U.S. Pat. No. 6,385,099.

BACKGROUND

This invention relates generally to level shifters that are utilized for example in shifting voltage levels in memories such as flash memories.

Flash memories may need a plurality of different voltage levels to perform read, programming and erase functions. Generally these voltages are produced by on chip charge pumps. A charge pump is a DC-to-DC voltage converter. The charge pump generates a desired voltage level by selectively clocking capacitors and transistors in a prescribed sequence.

Charge pumps may include a number of different stages. The amount of input current to the charge pump is generally proportional to the number of those stages. The voltages generated by the charge pump are eventually coupled to the gate, drain and source terminals of flash memory cells in a flash memory array by way of decoder and switch circuits. The decoder and switch circuits may be constructed using complementary metal oxide semiconductor (CMOS) transistors. As a result, they may have a predetermined amount of associated capacitance.

The capacitance of the decoder and switch circuits may be significant. As a result, it may be necessary to keep the decoder and switch circuits in a ready state for memory read operations to achieve fast read access times. Thus, this capacitance is normally charged to prescribed read voltage levels during read mode. The read mode may include sequences when memory reads occur and intervening time periods between memory operations. During the-intervening periods, the chip may assume a low power or standby state. Thus, this charging of capacitance, even in the low power or standby state may result in substantial leakage.

Subthreshold leakage occurs in these decoder and switch circuits. The leakage is significant because the decoder and switch capacitance must be fully charged even during standby. The leakage results in input current and therefore adds to the average current consumed during standby.

The widespread use of portable systems with on-board flash memories increases the need to limit power consumption. Even relatively small amounts of standby power consumption in devices with a large number of transistors may result in considerable drain in battery powered systems. Limited battery life means that reducing overall power consumption is a critical design goal.

Leakage power consumption occurs in the absence of a switching event. Leakage power consumption may be due to non-zero reverse bias leakage and subthreshold current. With a large number of transistors, leakage power consumption can significantly contribute to overall power consumption. Subthreshold leakage is due to carrier diffusion between the source and drain regions of transistors in weak inversion. An MOS transistor in the subthreshold operating region may behave like a bipolar device, exhibiting exponential dependence on the gate-to-source voltage. Particularly when the gate-to-source voltage is smaller than, but very close to, the threshold voltage of the device, subthreshold leakage current may become significant.

Level shifters may be used in connection with the decoder and switch circuits. Steering logic may be utilized to select the appropriate voltage for a given memory function such as read, program or erase. Level shifters may experience significant standby power consumption.

Thus, there is a need to reduce level shifter standby power consumption.

DETAILED DESCRIPTION

Figure 1:
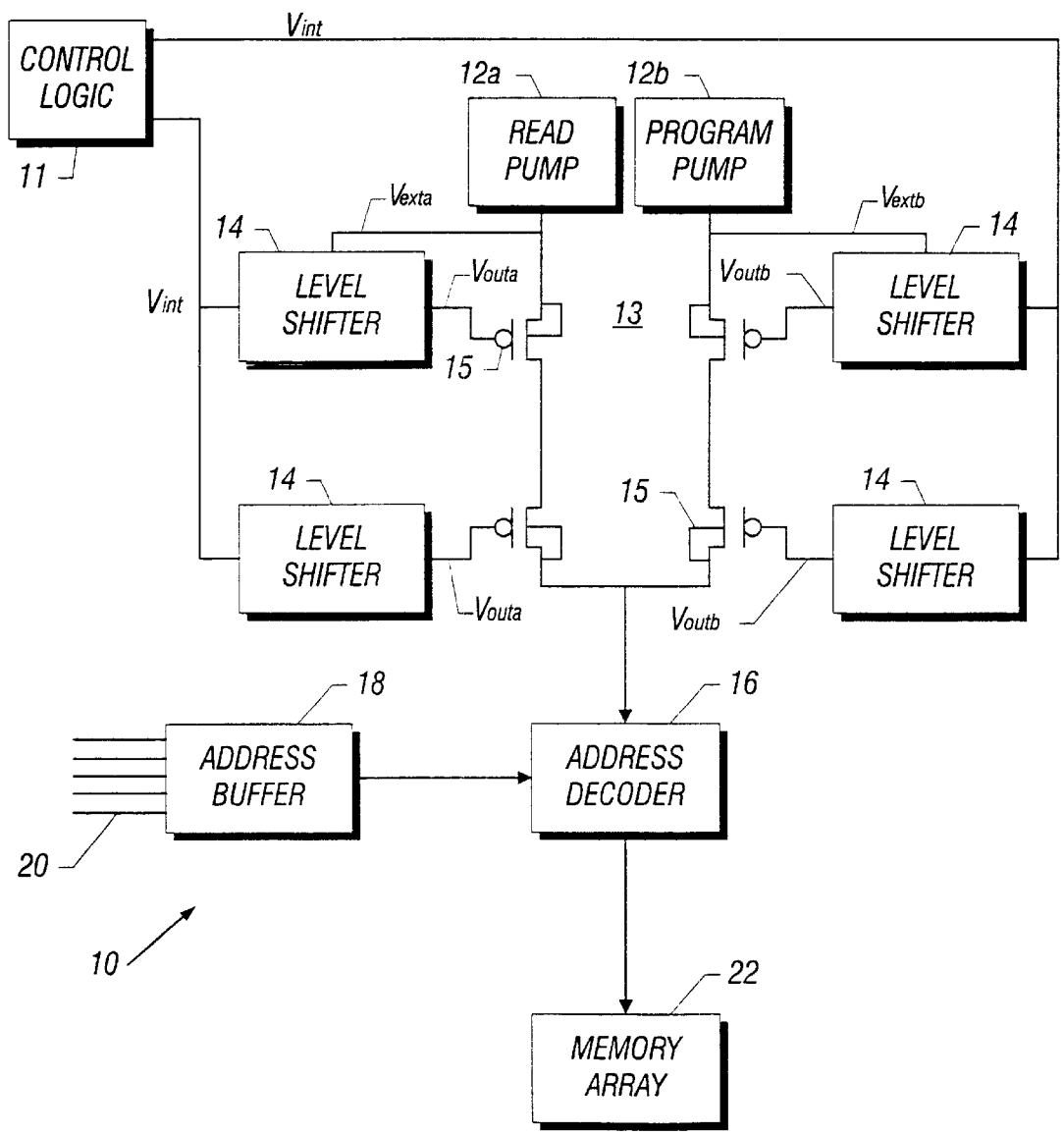
FIG. 1 is a block depiction of a flash memory in accordance with one embodiment of the present invention.

Referring to FIG. 1, a flash memory 10 may receive a supply voltage that may be boosted using one or more boosters or charge pumps 12 to one or more voltages indicated as $V_{ext}$. For example the boosted voltage $V_{exta}$ may be a read voltage (e.g. 5v.) and the boosted voltage $V_{extb}$ may be the program voltage (e.g. 11.5 v.). Each boosted voltage ($V_{ext}$) may then provide a supply voltage to a switch 13 including P-channel transistors 15. The external voltage $V_{ext}$ may than be supplied to a plurality of level shifters 14 that turn the P-channel transistors 15 on and off via the level shifter 14 output voltage ($V_{out}$). The control logic 11 supplies an input voltage ($V_{int}$) to each level shifter 15.

The output voltage from the switch 13 may be applied to an address decoder 16. The address decoder 16 may receive off chip address information 20, buffered by the address buffer 18. The address decoder 16 then supplies the appropriate voltage level signals to memory cells in the memory array 22.

Figure 2:
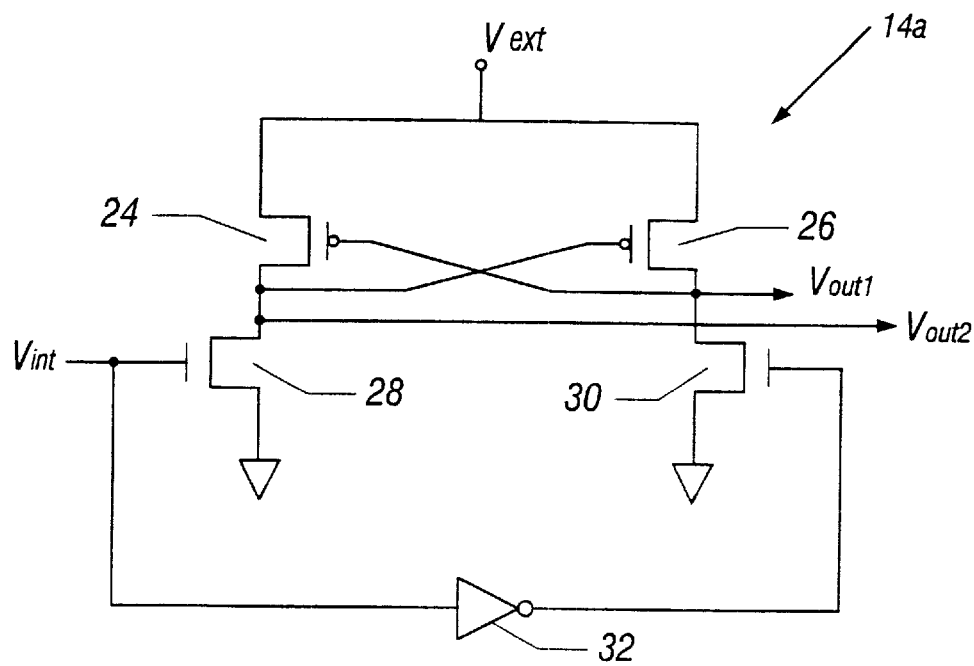
FIG. 2 is a circuit diagram for a level shifter in accordance with the prior art.

Referring to FIG. 2, a level shifter 14a, in accordance with the prior art, may experience significant standby subthreshold leakage current. The level shifter 14a receives the input voltage $V_{int}$ via the gate of an N-channel MOS input transistor 28. The input transistor 28 has its drain coupled to an output voltage ($V_{out2}$) node and its source coupled to ground. The input voltage $V_{int}$ may also be coupled through an inverter 32 to another N-channel MOS transistor 30 that also has its source grounded. The drain of the N-channel transistor 30 may be coupled to a output voltage ($V_{out1}$) node.

The drain of each N-channel transistor 28 or 30 is coupled to P-channel cross-coupled transistors 24 and 26. The sources of the P-channel transistors 24 and 26 may be coupled to an external voltage $V_{ext}$.

In operation, when the input voltage $V_{int}$ is low (such as zero volts), the input transistor 28 does not turn on. As a result, the output voltage $V_{out2}$ may rise to the level of the voltage $V_{ext}$. This is because the drain of the input transistor 28 is at a high potential, turning off the transistor 26. At the same time, the N-channel transistor 30 receives a high, inverted signal on its gate from the inverter 32. This gate voltage enables the transistor 30 to couple the $V_{out1}$ node to a ground or low potential. As a result, $V_{out}$ goes to ground and $V_{out2}$ goes to the voltage $V_{ext}$.

Even with a low level output voltage $V_{int}$, significant subthreshold leakage may be experienced by the N-channel transistor 28. Subthreshold leakage current is an exponential function of $V_{gs}$, the gate-to-source voltage, minus the threshold voltage ($V_t$) of the input transistor 28. When the input transistor 28 has a zero gate voltage and a grounded source bias, $V_{gs}$ is effectively zero volts. Thus, the subthreshold leakage is as follows:

$$I_{sub}=I_0\,(e^{(v_{gs}-\Delta vt)/s}-1)$$

where $I_0$ is the leakage when $V_{gs}-V_t=0$ and s is the subthreshold slope which is the rate of change of current through the transistor as a function of $V_{gs}$. $\Delta V_t$ is $V_{to}-V_{tbs}$ where $V_{to}$ is the threshold voltage when $V_{bs}$ is equal to zero and $V_{tbs}$ is the threshold voltage when $V_{bs}$ is not equal to zero.

Thus, when $V_{gs}-\Delta V_t$ is negative, the subthreshold leakage current may be equal to the subthreshold leakage current at $V_{gs}-\Delta V_t=0$ times a significantly small value. This may be a substantial reduction in the amount of leakage current.

During standby conditions, input transistor 28 operating or performance characteristics may not be very critical. There is no need to have a relatively high gate-to-source voltage in order to have effective input transistor 28 performance. Thus, during standby, the gate-to-source voltage of the input transistor 28 may be set relatively low. Conversely, during level shifting operations, a more substantial gate-to-source voltage may be advantageous.

Figure 3:
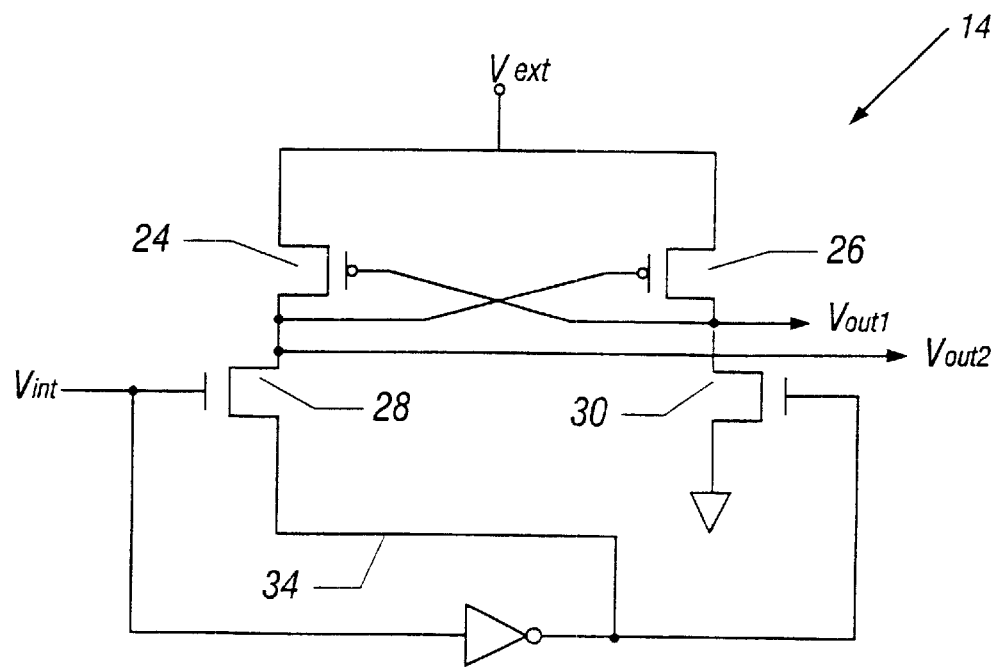
FIG. 3 is a circuit diagram for a level shifter in accordance with one embodiment of the present invention.

Referring to FIG. 3, a level shifter 14 may be similar to the level shifter 14a in FIG. 2. The source of the N-channel input transistor 28 may be coupled to the output of the inverter 32. Thus, in a standby mode, the source of the input transistor 28 is at a relatively higher voltage. During normal level shifting operations, the source of the input transistor 28 may be at a relatively lower voltage. As a result, during standby operations, the voltage $V_{gs}$ of the transistor 28 may be a larger negative voltage, related to a supply voltage. Conversely, during regular mode, when level shifting is occurring, $V_{gs}$ may be a positive voltage to provide desirable transistor operating characteristics.

As a result, the leakage current, in standby, may be reduced as much as one hundred times or more. This may result in current savings of a microamp or more depending on memory architecture. Coupling the source of transistor 28 to a positive voltage not only makes $V_{gs}$ negative, it also increases the threshold voltage of the transistor 28, further reducing subthreshold current.

In some embodiments, the subthreshold leakage current may be reduced for positive current pumps, allowing for lower standby current. Also, lower supply voltages may be used to achieve standby currents close to those that are offered on similar chips with higher supply voltages. Since the leakage current is reduced, faster flash memory read access times may be achieved, in some embodiments, because the internal capacitance may be charged to the read voltage while still meeting the desired standby current consumption requirements.

More than two voltages (read and program) may be handled in other embodiments of the present invention. Also, a different inverter may be used to drive the source high. The same approach may also be and with the transistor 30.

While the present invention has been described with respect to a limited number of embodiments, those skilled in the art will appreciate numerous modifications and variations therefrom. It is intended that the appended claims cover all such modifications and variations as fall within the true spirit and scope of this present invention.

What is claimed is:

1. A system comprising:
    a memory array; and
    a level shifter coupled to said memory array, said level shifter comprising:
       an input transistor having a gate-to-source voltage;
       a device to reduce the gate-to-source voltage of the input transistor during standby mode and to increase the gate-to-source voltage of the input transistor during operating mode.
2. The system of claim 1 wherein said device reduces the subthreshold leakage current during standby mode.
3. The system of claim 2 wherein said device provides a higher source voltage to said input transistor during standby mode.
4. The system of claim 3 wherein said device provides a lower source voltage to said input transistor during operating mode.
5. The system of claim 4 wherein said device includes an inverter.
6. The system of claim 5 wherein said input transistor is an N-channel input transistor.
7. The system of claim 6 wherein the source of said input transistor is coupled to the output of said inverter.
8. The system of claim 1 wherein said device increases the threshold voltage of the input transistor in the standby mode.
9. The system of claim 8 wherein said device increases the threshold voltage of the input transistor causing the gate-to-source voltage to become negative.
10. The system of claim 1 wherein said input transistor has a gate, source and drain, the gate coupled to receive an input to the level shifter, said device including an inverter coupled to the gate, the inverter having an input and an output, the source of the input transistor coupled to the inverter output.
11. The system of claim 10 including a pair of P-channel transistors, each including a drain, one of said P-channel transistors having its drain coupled to the drain of the input transistor.
12. The system of claim 11 including a second N-channel transistor, said second N-channel transistor coupled to the drain of one of said P-channel transistors, said second N-channel transistor having a gate, source and drain.
13. The system of claim 12, wherein the output of the inverter is coupled with the gate of said second N-channel transistor.
14. The system of claim 13, wherein the source of said second transistor is coupled to the ground.
15. The system of claim 1 including control logic coupled to said level shifter.
16. The system of claim 1 wherein said array is a flash memory array.
17. The system of claim 16 including control logic, a pair of charge pumps, a switch coupled to the charge pumps, and a plurality of level shifters coupled to said switch.
18. The system of claim 17 wherein the output of one of said charge pumps is coupled to one of level shifters and said switch and the output of the other of said charge pumps is coupled to another of said level shifters and said switch.
19. The system of claim 18 wherein one of said charge pumps provides a voltage level for reading and the other of said charge pumps provides a voltage level for programming.
20. The system of claim 19 wherein one of said level shifters includes a pair of output voltage nodes.

* * * * *